March 23, 1971 A. T. MONACO 3,572,428
CLAMPING HEAT SINK
Filed Jan. 29, 1969

INVENTOR.
ANTHONY T. MONACO
BY Mueller, Aichele & Rauner
ATTORNEYS.

3,572,428

CLAMPING HEAT SINK

Anthony T. Monaco, Skokie, Ill., assignor to Motorola, Inc., Franklin Park, Ill.

Filed Jan. 29, 1969, Ser. No. 795,018

Int. Cl. H01l 1/12

U.S. Cl. 165—80 3 Claims

ABSTRACT OF THE DISCLOSURE

A clip-on heat sink for use with thermo-pad type transistors is made in the form of a unitary piece of heat-conductive, black-anodized spring aluminum folded on itself approximately at its center to provide an opening which fits over the transistor and tightly engages the transistor in heat conductive relationship. The portions of the spring material extending away from the bight formed by the fold converge to form clamping jaws, with the material at the ends of the jaws being bent back to extend in substantially parallel planes along each of the converging portions beyond the bight formed by the fold at the center of the spring to provide a pair of gripping extensions which can be relatively moved toward and away from one another to spread the jaws apart to enable placement of the heat sink clip over the transistor.

BACKGROUND OF THE INVENTION

In the efficient design of electronic apparatus it often is necessary to concentrate a large number of electronic components in a relatively small confined space. Some of the components which necessarily form a part of a circuit confined in such a small space operate at relatively high temperatures and act as small but intense heat sources. In order to prevent damage to these components and to adjacent components, it becomes necessary to provide a means for dissipating the heat generated by the components, and such heat dissipation must take place in the confined space in which all of the components are mounted. When relatively large electronic components have been used in the past, it has been the practice to provide somewhat bulky heat dissipating devices in the form of large finned radiators or large blocks of heat dissipating material in order to distribute the heat generated by the heat sources.

In addition it is desirable to provide a heat sink or heat dissipating structure which is readily placed in a heat conductive relationship with an electronic component and which is easy to install and relatively inexpensive to manufacture. Since electronic components often are mounted on printed circuit boards, there is no means for dissipating the heat readily into the circuit board since it does not act as a good heat conductor. As a consequence the heat dissipating device or heat sink must necessarily be mounted on the electronic component itself and provide a sufficient means for dissipating the heat generated by the component.

SUMMARY OF THE INVENTION

Accordingly, it is an object of this invention to provide a heat dissipating device which is readily attached to an electronic component.

It is another object of this device to provide an improved heat dissipating device for an electronic component, which device can be applied easily by hand and which will retain itself in place once it is applied.

It is a further object of this invention to provide an improved heat sink of a simple configuration which may be inexpensively manufactured with little waste material.

In accordance with a preferred embodiment of the invention, a heat sink for electronic components is fabricated from a single rectangular strip of heat conductive spring material which is folded upon itself at its center to define an opening which will accommodate the electronic component with which the heat sink is to be used. The material forms a pair of relatively straight converging jaws, with the spring material at the ends of the jaws being reversely bent back to extend substantially parallel to the jaws beyond the bight formed by the fold in the center of the material. These extensions, when they are moved toward one another, spread the jaws apart to enable placement of the heat sink over an electronic component. Upon release of the extensions, the heat sink spring material grips the component in a heat conductive relationship therewith.

DETAILED DESCRIPTION

Figure 1:
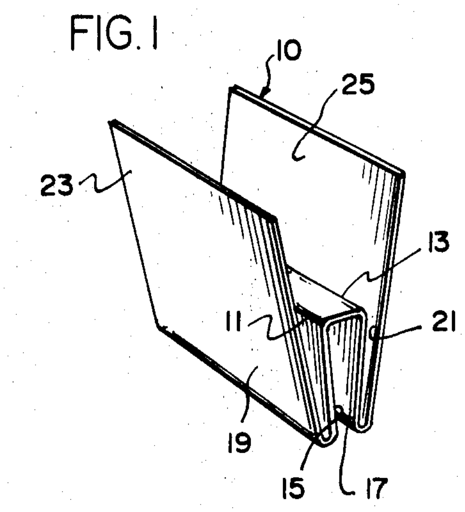
FIG. 1 is a perspective view of a preferred embodiment of the heat sink of this invention.
Figure 2:
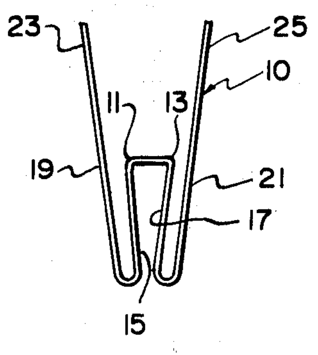
FIG. 2 is a side view of the heat sink shown in FIG. 1.

Referring now to the drawing, in which similar reference numerals are used throughout several views, there is shown a heat sink or heat dissipating device 10 formed from a single strip of rectangular spring material, which preferably is of metal such as heat treated black-anodized aluminum. Aluminum is preferred over spring steel since it is a better heat conductor, and the black anodizing further enhances heat conduction into the material. The strip is doubly folded approximately at its center forming a pair of bends 11 and 13, each exceeding 90° to provide a pair of converging jaw portions 15 and 17. It will be noted, especially from an examination of FIG. 2, that the jaw portions 15 and 17 at the ends remote from the bight formed by the folds 11 and 13 are substantially closer together than the distance between the folds 11 and 13. At the ends of the jaw portions 17 and 15, the spring material is reversely folded to form a pair of extensions 19 and 21 which extend back parallel to the jaw portions 15 and 17 and past the bight formed by the folds 11 and 13 to terminate in a pair of gripping portions 23 and 25.

When the gripping portions 23 and 25 are manually squeezed together, movement of the extensions 23 and 25 toward one another causes the jaw portions 15 and 17 to be moved apart, so that the device may be slipped over an electronic component to which the device is to be attached.

Figure 3:
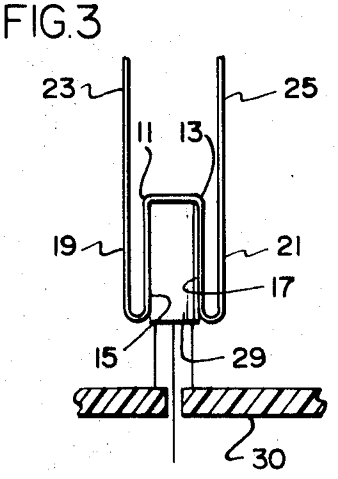
FIG. 3 shows the heat sink of FIGS. 1 and 2 applied to an electronic component mounted on a circuit board.
Figure 4:
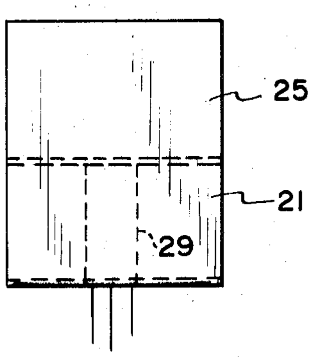
FIG. 4 is a side view of the heat sink applied to the component shown in FIG. 3.

Referring now to FIG. 3, when the extensions 23 and 25 are squeezed together to open the jaws 15 and 17, the heat sink device 10 may be slipped over an electronic component such as a thermo-pad transistor 29 mounted on a circuit board 30. The transistor 29 may be of a type such as the K–77 manufactured by Motorola, Inc. The distance between the folds 11 and 13 is chosen to be just slightly greater than the outside dimension of the transistor 29; so that when the jaws 15 and 17 are opened to accommodate the transistor 29, the sides of the jaws extend substantially parallel to the sides of the transistor 29 in close heat conductive relationship therewith. Releasing the extensions 23 and 25 then permits the spring material out of which the device 10 is formed to attempt to cause the jaws 15 and 17 to return to their original converged position. This causes the heat sink device 10 to firmly grip the transistor 29, so that the heat sink 10 cannot be readily shaken loose from the transistor 29 and further insures a good heat conductive relationship between the transistor 29 and the extensions 19 and 21 of the heat sink 10.

If it becomes necessary to remove the heat sink 10 from the transistor 29, all that is required is that the extensions 23 and 25 once again be squeezed together to open the jaws 15 and 17, and the heat sink 10 may be readily removed from the transistor 29. In addition, because the material is formed from a single rectangular sheet of metal spring material, the manufacture of this heat sink is relatively simple and can be accomplished with a minimum waste of the material out of which the heat sink is formed.

Although the heat sink 10 shown in the drawings is one in which the jaws 15 and 17 have flat surfaces for accommodating a transistor 29 also having flat rectangular sides, other configurations of the jaws 15 and 17 may be provided for accommodating electronic components having shapes other than the shape of the transistor 29 shown in the drawings. Of course if such configurations are employed, it may be necessary to provide additional steps in the fabrication of the heat sink 10 in order to form the jaws 15 and 17 to conform to the external shape of such components.

I claim:

1. A heat sink for fitting over and engaging electronic components, said heat sink comprising a flat unitary piece of heat conductive heat treated aluminum spring material having a center portion and first and second end portions, the center portion of the material doubly folded approximately at its center in two folds of substantially 90° to define an opening which is slightly larger than the outside dimension of the electronic component with which the heat sink is to be used, at least the center portion of the material having substantially parallel edges, a pair of relatively straight converging portions extending from each of the folds to provide clamping jaws, with the spring material at the ends of the jaws being reversely bent back to extend in substantially parallel planes along each of the converging portions, with the bent back material extending substantially beyond the bight formed by the folds at the center of the material to provide a pair of gripping extensions terminating in the first and second end portions which, when moved toward one another, spread the jaws apart to enable placement of the heat sink over the electronic component, whereupon releasing of the extensions causes the heat sink to grip the electronic component in heat conductive relationship therewith.

2. Apparatus according to claim 1 wherein the spring material is a flat, rectangular piece.

3. Apparatus according to claim 1 wherein the unitary piece of heat conductive heat treated aluminum spring material is black anodized aluminum.

References Cited

UNITED STATES PATENTS

| | | | |
|---|---|---|---|
| 3,187,812 | 6/1965 | Staver | 174—16X |
| 3,407,868 | 10/1968 | Coe | 165—185 |

FOREIGN PATENTS

| | | | |
|---|---|---|---|
| 227,586 | 4/1960 | Australia | 317—234 |

OTHER REFERENCES

Mulligan, J. M.: IBM Technical Disclosure Bulletin, vol. 10, No. 8, p. 1242, January 1968.

ALBERT W. DAVIS, Jr., Primary Examiner

U.S. Cl. X.R.

165—185; 174—16, 35.5; 317—234/1, 100